United States Patent
Li et al.

(10) Patent No.: US 7,123,662 B2
(45) Date of Patent: Oct. 17, 2006

(54) OFDM DETECTION APPARATUS AND METHOD FOR NETWORKING DEVICES

(75) Inventors: Kuo-Hui Li, Hsinchu (TW); Hung-Kun Chen, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 717 days.

(21) Appl. No.: 10/463,743

(22) Filed: Jun. 17, 2003

(65) Prior Publication Data
US 2003/0215022 A1    Nov. 20, 2003

(51) Int. Cl.
H04K 1/10 (2006.01)
H04L 27/04 (2006.01)
H04J 11/00 (2006.01)

(52) U.S. Cl. ............ 375/260; 375/295; 370/208

(58) Field of Classification Search .......... 375/260, 375/295, 343, 150, 316; 370/208, 503
See application file for complete search history.

(56) References Cited

U.S. PATENT DOCUMENTS 6,438,183 B1 * 8/2002 Taura et al. .......... 375/343
6,754,292 B1 * 6/2004 Pulley et al. .......... 375/343
2003/0072255 A1 * 4/2003 Ma et al. .......... 370/208

* cited by examiner

Primary Examiner—Khai Tran
(74) Attorney, Agent, or Firm—Thomas, Kayden, Horstemeyer & Risley

(57) ABSTRACT

An OFDM detection apparatus and method for networking devices. First, a sample sequence is taken from the beginning of a newly arrived network packet. Next, a first correlation sequence between the complex conjugate of the sample sequence and the sample sequence with a lag of N samples is formed. In the meantime, a second correlation sequence between the complex conjugate of the sample sequence and the sample sequence with a lag of M samples is also formed. The first and the second correlation sequence are then normalized. Depending on a comparison between the first normalized correlation sequence and a first predetermined threshold as well as another comparison between the second normalized correlation sequence and a second predetermined threshold, the newly arrived network packet is determined accordingly whether it is an OFDM modulated packet.

20 Claims, 4 Drawing Sheets

OFDM DETECTION APPARATUS AND METHOD FOR NETWORKING DEVICES

BACKGROUND OF THE INVENTION

1. Field of the Invention

The invention relates to wireless networking, and more particularly to a detection scheme of Orthogonal Frequency Division Multiplexing (OFDM) signals for an IEEE 802.11g receiver.

2. Description of the Related Art

With the emergence of a converged standard for wireless local area networks (WLANs), the stage is set for a multimode marketplace. Much like its wired predecessor, wireless Ethernet (802.11) will flourish in an environment characterized by multimode operation. Convergence of the separate 10- and 100-megabit per second technologies of wired Ethernet into the now familiar 10/100 networks accelerated the market's acceptance of wired Ethernet. The same should be expected of WLAN technology and the merging of the 802.11b and 802.11a versions of the standard into 802.11g.

In 1997, the first wireless Ethernet standard, known simply as 802.11, was adopted and published by the IEEE. This unified standard provided several modes of operation and data rates up to two megabits per second (Mbps). Work soon began on improving the performance of 802.11. The eventual results were two new but incompatible versions of the standard, 802.11b and 802.11a. The "b" version operated in the same frequency range as the original 802.11, the 2.4 GHz Industrial-Scientific-Medical (ISM) band, but the "a" version ventured into the 5 GHz Unlicensed National Information Infrastructure (U-NII) band. 802.11b mandated complementary code keying (CCK) for rates of 5.5 and 11 Mbps, and included as an option Packet Binary Convolutional Coding (PBCC) for throughput rates of 5.5 and 11 Mbps, and additional range performance. It also supported fallback date rates of 2 Mbps and 1 Mbps, using the same Barker coding used in the original 802.11 standard. 802.11a turned to another multi-carrier coding scheme, orthogonal Frequency Division Multiplexing (OFDM), and achieves data rates up to 54 Mbps. Because 802.11b equipment was simpler to develop and build, it arrived in the marketplace first. 802.11b technology soon established a foothold in the market and is proved the viability of WLAN technology in general.

In March of 2000, the IEEE 802.11 Working Group formed a study group to explore the feasibility of extending the 802.11b standard to data rates greater than 20 Mbps in the 2.4 GHz spectrum. For a year and a half, this group, which came to be known as the Task Group G, studied several technical alternatives until it finally adopted a hybrid solution that included the same OFDM coding and provided the same physical data rates of 802.11a. But this version of the draft standard, 802.11g, occupied the 2.4 GHz band of the original 802.11 standard. Several optional coding schemes were incorporated into 802.11g, including CCK-OFDM and PBCC, the latter of which provides alternative data rates of 22 and 33 Mbps. Briefly, the IEEE 802.11g draft standard requires the use of OFDM for data rates up to 54 Mbps and requires the support for CCK to ensure backward compatibility with existing 802.11b radios as mandatory parts. Because it integrates two technical solutions that had been totally separate and quite incompatible, the 802.11g standard thereby provides for true multimode operations.

Therefore, an 802.11g receiver must have the capability to detect both OFDM and CCK signals. In essence, the detection probability of a valid OFDM packet is required to exceed 90% within 4 μs when a receive level is equal to or greater than −82 dBm. The false-alarm probability, which means the probability of mistakenly detecting an OFDM packet as transmitting CCK packets, must be kept low enough to ensure a good packet error rate (PER) for the receiver's CCK module. Because Bluetooth devices and microwave ovens both operate in the same 2.4 GHz band, the 802.11g receiver also requires a low probability of false alarm with respect to Bluetooth and microwave oven radios in order to achieve high data throughput. In view of the above, what is needed is an efficient scheme of OFDM detection and CCK/Bluetooth rejection to meet the requirements.

SUMMARY OF THE INVENTION

It is an object of the present invention to provide a method and apparatus for OFDM detection in an 802.11g receiver.

The present invention is generally directed to a method and apparatus for detection of OFDM packets in a multimode WLAN environment. According to one aspect of the invention, an OFDM detection apparatus for networking devices is proposed. The apparatus of the invention is made up of a decision making unit and a processing unit including a first through sixth means. The processing unit takes a sample sequence from the beginning of a newly arrived network packet and outputs a first signal and a second signal. The first means is employed to calculate a first correlation sequence between the complex conjugate of the sample sequence and the sample sequence with a first lag of N samples. The second means is employed to calculate a second correlation sequence between the complex conjugate of the sample sequence and the sample sequence with a second lag of M samples, where M≠N. The second and the fourth means are configured to evaluate first accumulative energy of the sample sequence with the first lag of N samples and second accumulative energy of the sample sequence with the second lag of M samples, respectively. Depending on a comparison between the first correlation sequence and the first accumulative energy scaled by a first predetermined threshold, the first signal is asserted by the fifth means. On the other hand, the second signal is asserted by the sixth means depending on another comparison between the second correlation sequence and the second accumulative energy scaled by a second predetermined threshold. If the first and the second signals are both asserted, the decision making unit identifies the newly arrived network packet as an OFDM modulated packet.

According to another aspect of the invention, an OFDM detection method for networking devices is proposed. The first step of the invention is to take a sample sequence from the beginning of a newly arrived network packet. Then, a first correlation sequence between the complex conjugate of the sample sequence and the sample sequence with a first lag of N samples is calculated. In the meantime, a second correlation sequence between the complex conjugate of the sample sequence and the sample sequence with a second lag of M samples is calculated as well, where M is not equal to N.

The first and the second correlation sequences are normalized to obtain a first evaluation sequence and a second evaluation sequence, separately. According to a comparison between the first evaluation sequence and a first predetermined threshold as well as another comparison between the second evaluation sequence and a second predetermined threshold, the newly arrived network packet is therefore determined whether it is an OFDM modulated packet.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
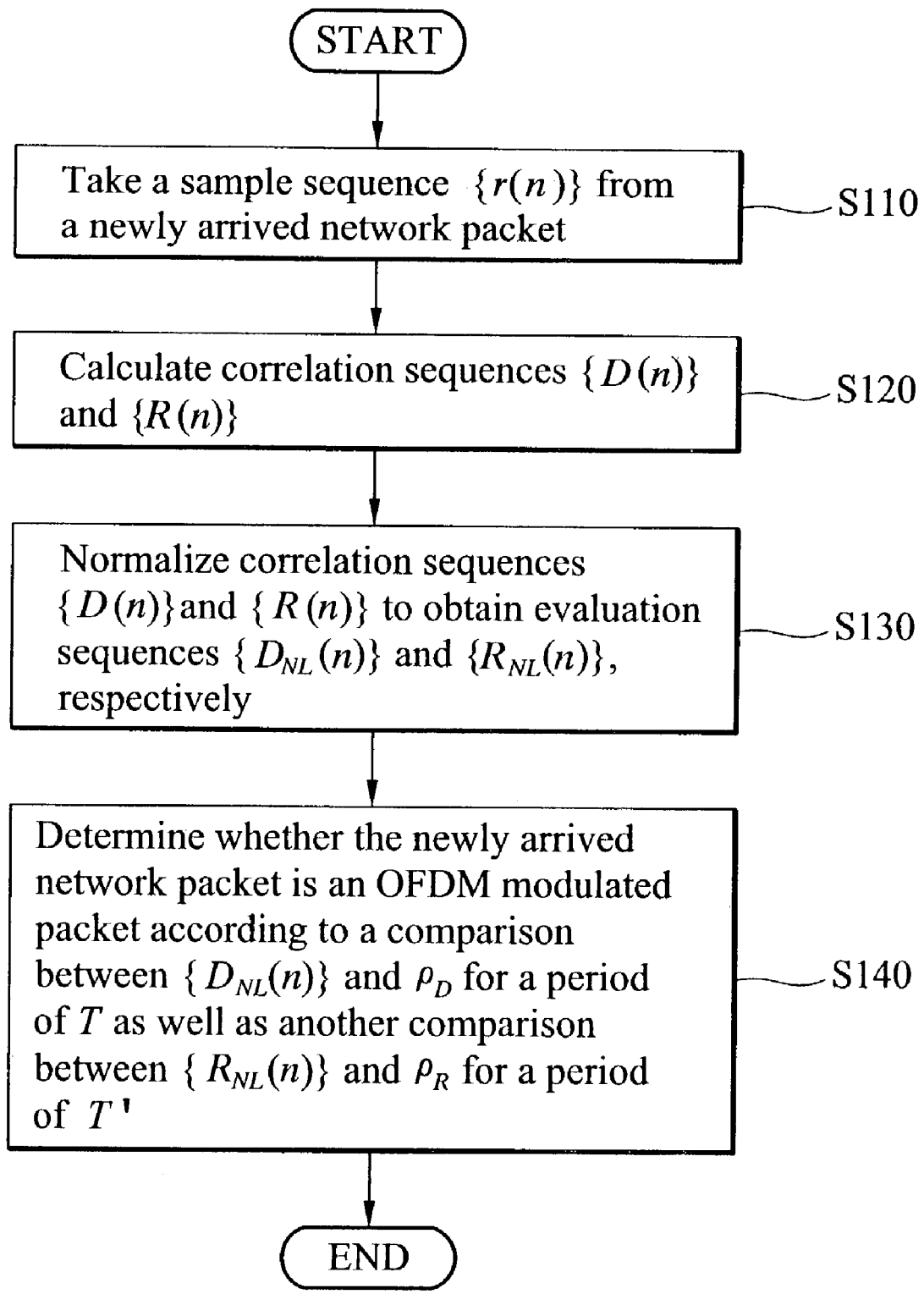
FIG. 1 is a flowchart illustrating primary steps for OFDM detection according to the invention.

To begin with, the proposed algorithm is introduced herein and derived in terms of mathematical expressions. According to the IEEE 802.11g standard, the PLCP preamble field in each transmitted data packet includes ten short training symbols and two long training symbols. The first ten short symbols are the same and used for AGC convergence, diversity selection, timing acquisition, and coarse frequency estimation. Each of the short symbols has a period of $t_{SHORT}=0.8$ µs. Since they are constant and identical when transmitted, the short symbols are suitable for OFDM detection in a conformant 802.11g receiver. Denoting received samples taken from the beginning of a newly arrived network packet by $r(0), r(1), \ldots, r(n), \ldots$, in which n represents discrete instances in time. Each sample of the sequence $\{r(n)\}$ is a complex number in baseband. According to the invention, the sample sequence is correlated with itself is with a lag of one short symbol as follows:

$$D(n) = \left| \sum_{k=0}^{n} r^*(k) \cdot r(k-N) \right|; r(k-N) = 0, k < N \quad (1.1)$$

where superscript * denotes complex conjugation, k denotes an integer index, and N denotes the lag equal to the number of samples during one short symbol. As will be appreciated by those skilled in the art, in general, the lag N may also be more than one short symbol. Moreover, it should be understood that equation (1.1) is equivalent to an equation of the form:

$$D(n) = \left| \sum_{k=0}^{n} r^*(k) \cdot r(k-N) \right|; r(k-N) = 0, k < N$$

If the 802.11g receiver is operating at a sampling rate of fs, the lag N is set to $f_s \cdot t_{SHORT}$ number of samples. In the case of a valid OFDM transmission, the correlation can create peaks due to the identity of the short training symbols. Prior to determination of the received packet, the energy of the sample sequence with the lag N is computed from:

$$E_D(n) = \sum_{k=0}^{n} |r(k-N)|^2 \quad (1.2)$$

and the correlation is normalized with respect to the accumulative energy $E_D(n)$. If the normalized correlation exceeds a predetermined threshold $\rho_D$ for a period of T samples, i.e., $$\frac{D(n)}{E_D(n)} \geq \rho_D, \forall n = N_1, N_1+1, \cdots, N_1+T-1 \quad (1.3)$$

then the newly arrived network packet is said to be an OFDM modulated packet. In order to cover an entire short training symbol at least, the period T preferably begins from time instant 2N−1 so $N_1=2N-1$.

Although a received packet is identified as an OFDM is modulated packet provided that the correlation indicates a high degree of agreement between the sequence $\{r(n)\}$ and its lagged version $\{r(n-N)\}$. However, this may mistake CCK, Bluetooth and microwave oven signals for a desired OFDM packet, which results in poor system performance due to a false alarm. Accordingly, there is a need for another procedure to further examine the received packet. The proposed algorithm includes a second part to reject CCK, Bluetooth and microwave oven signals for the purpose of OFDM detection. To discriminate CCK/Bluetooth/microwave oven signals from OFDM packets, the sample sequence $\{r(n)\}$ is correlated with itself with a second lag instead. Thus, $$R(n) = \left| \sum_{k=0}^{n} r^*(k) \cdot r(k-M) \right|; r(k-M) = 0, k < M \quad (1.4)$$

where M denotes the second lag rather than one short symbol. As mentioned above, a short OFDM training symbol consists of $N=f_s \cdot t_{SHORT}$ samples, so $M \neq N$. The energy of the sample sequence with the lag M is computed from:

$$E_R(n) = \sum_{k=0}^{n} |r(k-M)|^2 \quad (1.5)$$

and the second correlation is normalized with respect to the accumulative energy $E_R(n)$. If the received packet is actually OFDM modulated, this correlation cannot create periodic strong peaks since it is obtained according to the second lag inconsistent with the periodicity of the short OFDM training symbol. As a result, CCK, Bluetooth and microwave oven signals are rejected if the normalized correlation is below another predetermined threshold PR for a period of T' samples, that is, $$\frac{R(n)}{E_R(n)} \leq \rho_R, \forall n = M_1, M_1 + 1, \cdots, M_1 + T' - 1 \quad (1.6)$$

Therefore, the newly arrived network packet is determined to be an OFDM modulated packet provided that the above criteria are both satisfied. In order to cover an entire period of M samples at least, the period T' preferably begins from time instant 2M−1 so $M_1=2M-1$.

Referring to FIG. 1, a flowchart of primary steps for OFDM detection in 802.11g systems is illustrated. The first step of the invention is to take a sample sequence, $\{r(n)\}$, from the beginning of a newly arrived network packet (step S110). Next in step S120, a first correlation sequence between the complex conjugate of the sample sequence and the sample sequence with a first lag of N samples is calculated. Meanwhile, a second correlation sequence between the complex conjugate of the sample sequence and the sample sequence with a second lag of M samples is calculated as well, where M is not equal to N. In one embodiment, the 802.11g system is operating at a sampling rate of $f_s=20$ MHz so N is equal to 16. The second lag of M is set to 20 for example. The first and the second correlation sequences, $\{D(n)\}$, $\{R(n)\}$, are given by:

$$D(n) = \left|\sum_{k=0}^{n} r^*(k) \cdot r(k-16)\right|; r(k-16) = 0, k < 16 \quad (2.1)$$

and $$R(n) = \left|\sum_{k=0}^{n} r^*(k) \cdot r(k-20)\right|; r(k-20) = 0, k < 20 \quad (2.2)$$

where $\{r(k)\}$ also denotes the sample sequence, $\{r^*(k)\}$ denotes the complex conjugate of the sample sequence, D(n) denotes a sample value of the first correlation sequence at time instant n, and R(n) denotes a sample value of the second correlation sequence at time instant n.

In step S130, the first and the second correlation sequences are normalized with respect to their accumulative energy, separately, and first and second evaluation sequences are obtained accordingly. The accumulative energy of $\{r(n)\}$ with a lag of 16 and the accumulative energy of $\{r(n)\}$ with a lag of 20, ED(n), ER(n), are computed from:

$$E_D(n) = \sum_{k=0}^{n} |r(k-16)|^2 \quad (2.3)$$

and $$E_R(n) = \sum_{k=0}^{n} |r(k-20)|^2 \quad (2.4)$$

Thus, the first and the second evaluation sequences, $\{D_{NL}(n)\}$, $\{R_{NL}(n)\}$ are given by:

$$D_{NL}(n) = \frac{D(n)}{E_D(n)} \quad (2.5)$$

and $$R_{NL}(n) = \frac{R(n)}{E_R(n)} \quad (2.6)$$

The process of the invention then proceeds to step S140 where the newly arrived network packet is determined whether it is an OFDM modulated packet according to a comparison between the first evaluation sequence and a first predetermined threshold as well as another comparison between the second evaluation sequence and a second predetermined threshold. In this regard, the first evaluation sequence is compared to the first predetermined threshold from time instant 2N−1 for a period of T samples, where T is a first predetermined interval. On the other hand, the second evaluation sequence is compared to the second predetermined threshold from time instant 2M−1 for a period of T' samples, where T' is a second predetermined interval. The longer intervals T and T' can achieve better detection performance but give rise to a slower system response. The proposed method can trade off performance with T, T', and system response. In one embodiment, T is set to 13 and T' is set to 9. Hence, if the following conditions can both hold true:

$$D_{NL}(n) \geq \rho_D, \forall n=31,32,\ldots,43 \quad (2.7)$$

and $$R_{NL}(n) \leq \rho_R, \forall n=39,40,\ldots,47 \quad (2.8)$$

then an OFDM modulated packet is detected.

Figure 2:
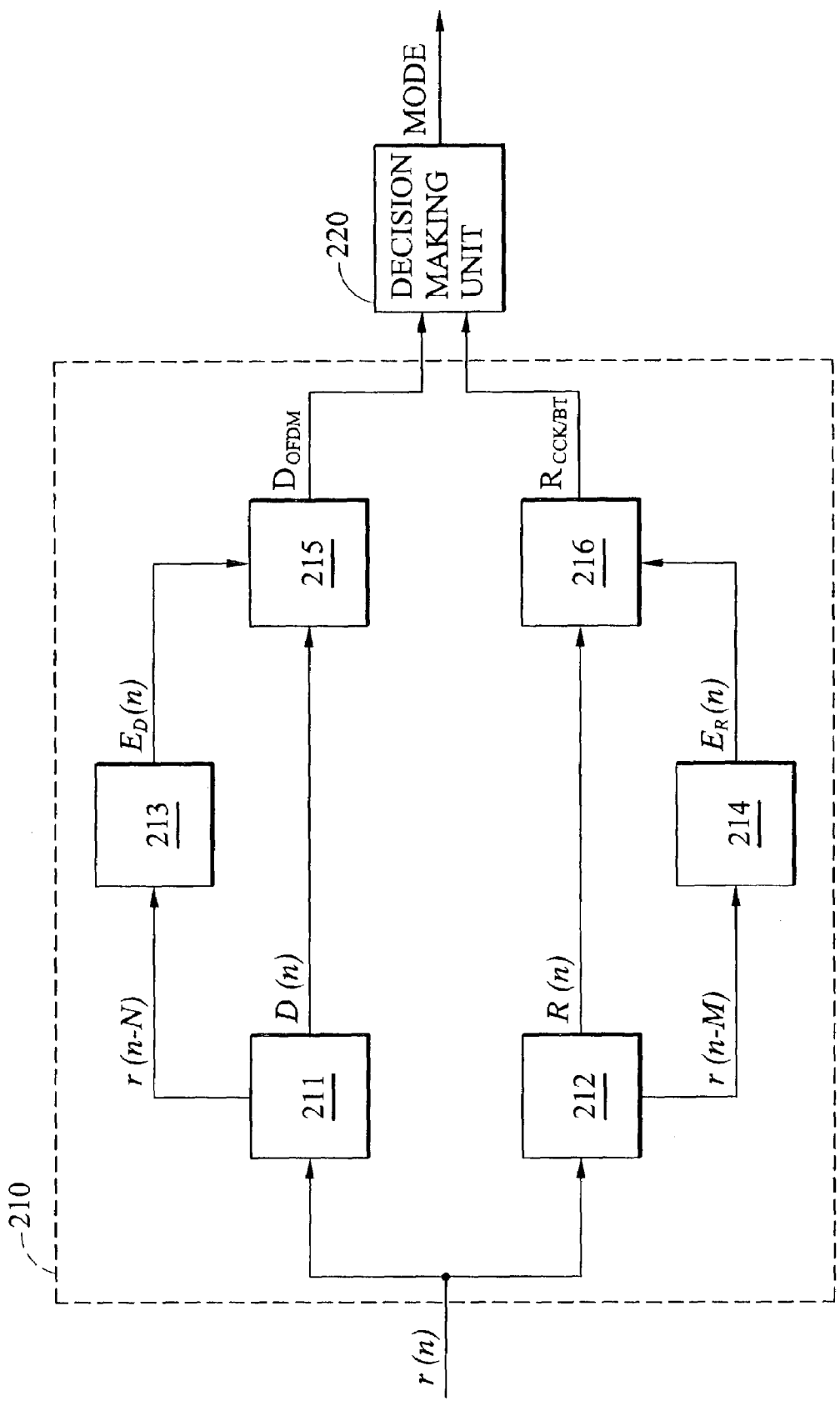
FIG. 2 is a functional block diagram illustrating an OFDM detection apparatus according to the invention.

Referring to FIG. 2, an OFDM detection apparatus that realizes the proposed algorithm in an 802.11g receiver is illustrated. According to the invention, the default operating mode of the 802.11g receiver is OFDM Mode. The apparatus of the invention is made up of a decision making unit 220 and a processing unit 210 including a first through sixth means. The processing unit 210 takes a sample sequence $\{r(n)\}$ from the beginning of a newly arrived network packet and outputs a first signal DOFDM and a second signal RCCK/BT. It is noted that r(0) may not be the first sample of the first short training symbol. With equations (2.1) and (2.2), the first means 211 and the second means 212 is calculate $\{D(n)\}$ and $\{R(n)\}$, respectively. In one embodiment, the third means 213 takes the sequence $\{r(n-N)\}$ from the first means 211 and the fourth means 214 takes the sequence $\{r(n-M)\}$ from the second means 212, where N=16 and M=20 for a conformant IEEE 802.11g receiver. With equations (2.3) and (2.4), the third means 213 and the fourth means 214 evaluate ED(n) and ER(n), separately. The third means 213 starts to obtain effective ED(n) from time instant 2N−1 while the fourth means 214 starts to obtain effective $E_R(n)$ from time instant 2M−1. Since division is more difficult than multiplication in hardware implementation, the OFDM detection apparatus of the invention does not perform normalization directly. Instead of equations (2.7) and (2.8), the fifth means 215 asserts the DOFDM signal depending on a comparison between $\{D(n)\}$ and $\{ED(n)\}$ scaled by PD over a period of T samples from time instant 2N−1. Likewise, the sixth means 216 asserts the $R_{CCK/BT}$ signal depending on another comparison between $\{R(n)\}$ and $\{E_R(n)\}$ scaled by $\rho_R$ over a period of T' samples from time instant 2M−1. To state more precisely, the $D_{OFDM}$ signal is asserted if the following condition can hold true:

$$D(n) \geq \rho_D \cdot E_D(n), \forall n = 31, 32, \ldots, 43 \quad (2.9)$$

and the $R_{CCK/BT}$ signal is asserted if the following condition can hold true:

$$R(n) \leq \rho_R \cdot E_R(n), \forall n = 39, 40, \ldots, 47 \quad (2.10)$$

If the signals $D_{OFDM}$ and $R_{CCK/BT}$ are both asserted, the decision making unit 220 identifies the newly arrived network packet as an OFDM modulated packet and keeps a MODE signal asserted. Otherwise, the MODE signal is de-asserted such that the 802.11g receiver switches from the default is operating mode to CCK mode.

Figure 3:
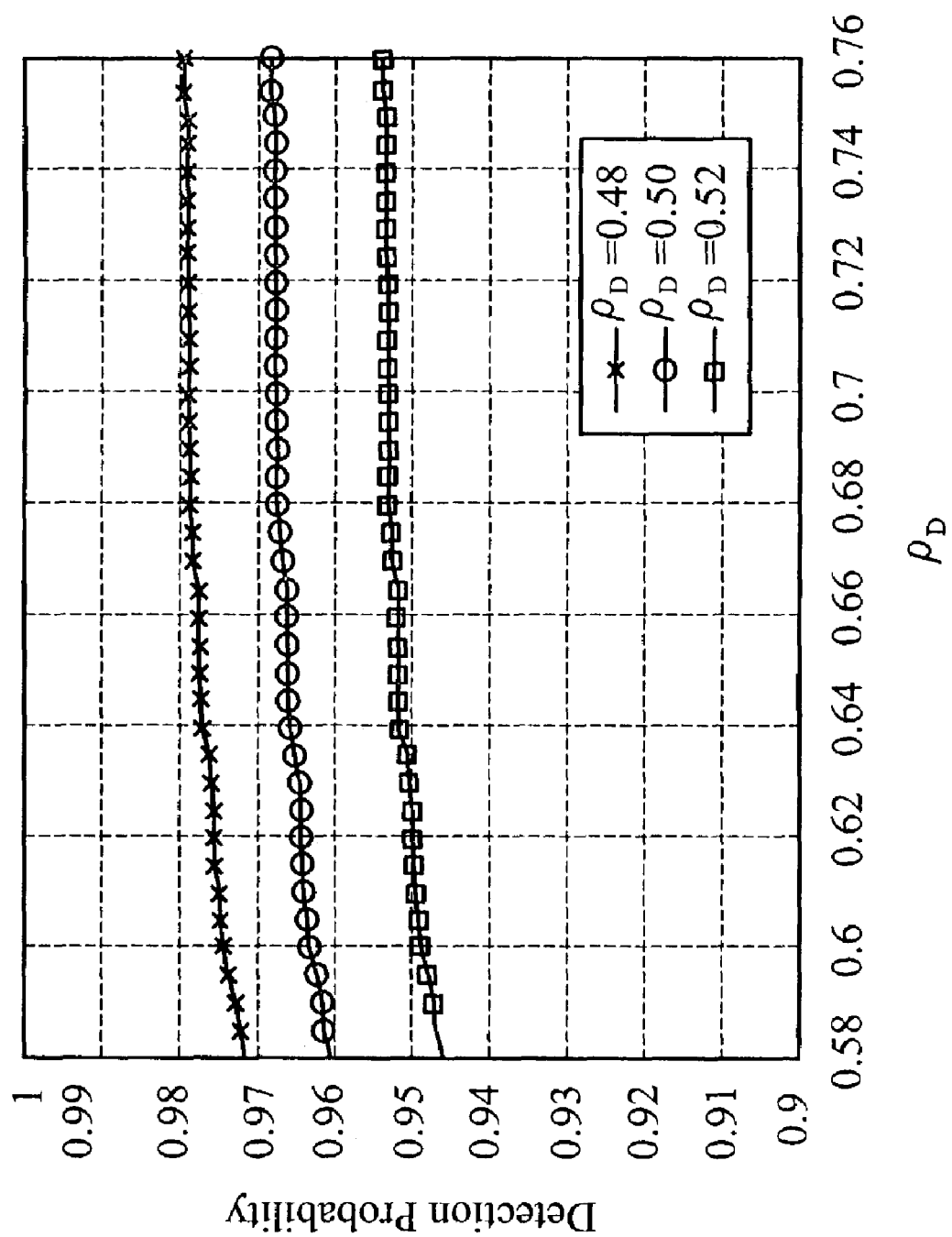
FIG. 3 is a simulation result showing the detection probability of the invention.
Figure 4:
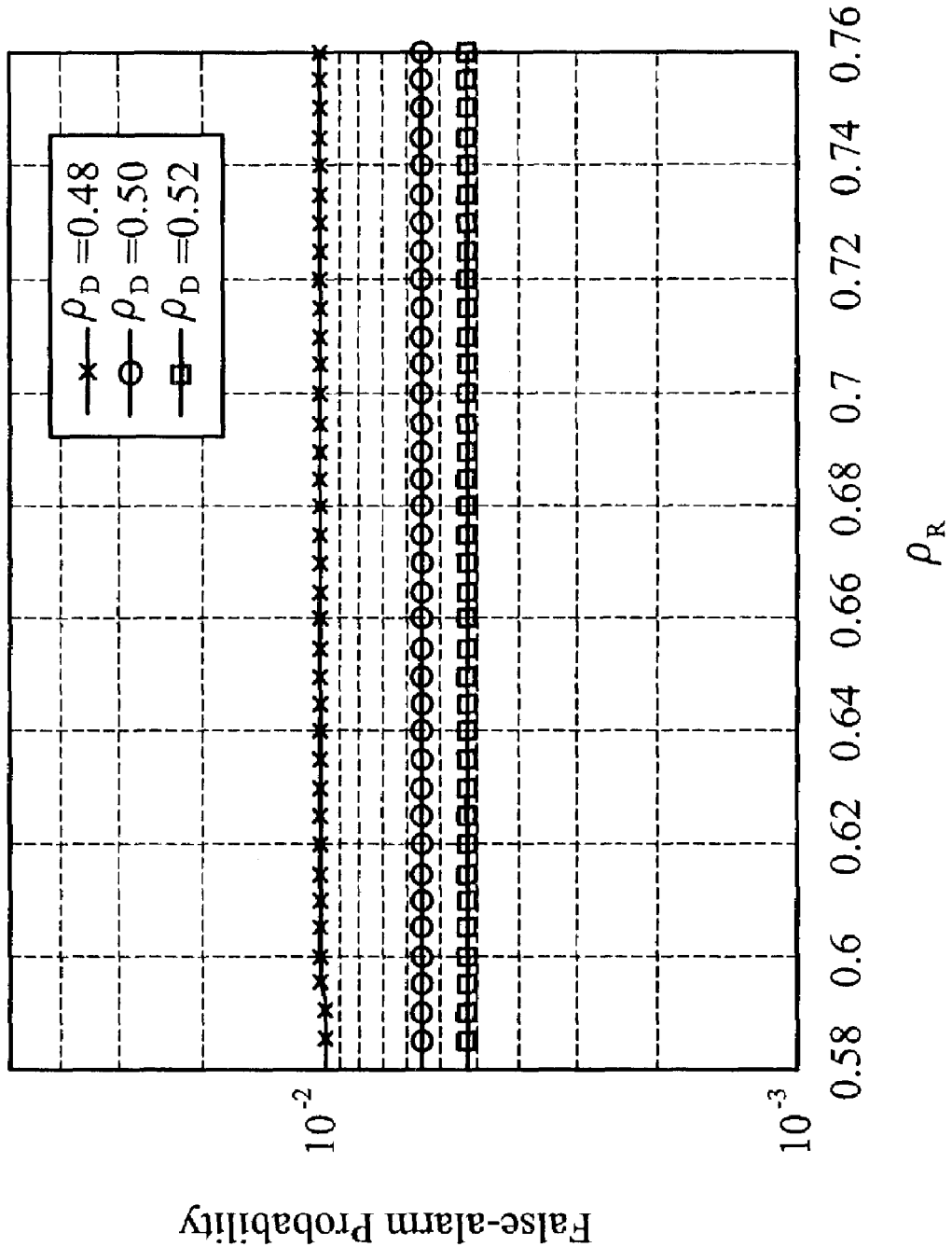
FIG. 4 is a simulation result showing the false-alarm probability of the invention.

In order to evaluate the detection probability and the false-alarm probability vs. the thresholds, the scheme of the present invention is simulated in an AWGN channel environment. To ensure a negligible performance loss, the detection probability is required to be greater than 95% and the false-alarm probability must be less than 1%. FIG. 3 shows the detection probability vs. $\rho_D$ and $\rho_R$ in an AWGN channel environment with $E_b/N_o = 7.5$ dB for OFDM signals while FIG. 4 shows the false-alarm probability vs. $\rho_D$ and $\rho_R$ in an AWGN channel environment with $E_c/N_o = 5$ dB for CCK signals. It is shown that $\rho_D = 0.50$ and $\rho_R = 0.65$ will meet the above requirements. Of course, this is not the only choice. In general, there are different values for $\rho_D$ and $\rho_R$ from different considerations.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An OFDM detection apparatus for networking devices, comprising:

a processing unit for taking a sample sequence from the beginning of a newly arrived network packet and outputting a first signal and a second signal, comprising:

a first means for calculating a first correlation sequence between the complex conjugate of said sample sequence and said sample sequence with a first lag of N samples, where N∈positive integer;

a second means for calculating a second correlation sequence between the complex conjugate of said sample sequence and said sample sequence with a second lag of M samples, where M∈positive integer and M≠N;

a third means for evaluating first accumulative energy of said sample sequence with said first lag of N samples;

a fourth means for evaluating second accumulative energy of said sample sequence with said second lag of M samples;

a fifth means for asserting said first signal according to a comparison between said first correlation sequence and the first accumulative energy scaled by a first predetermined threshold; and a sixth means for asserting said second signal according to another comparison between said second correlation sequence and the second accumulative energy scaled by a second predetermined threshold; and a decision making unit for identifying said newly arrived network packet as an OFDM modulated packet if said first and said second signals are both asserted.

2. The apparatus as recited in claim 1 wherein said fifth means asserts said first signal if said first correlation sequence over a first period of T samples is greater than or equal to the first accumulative energy scaled by said first predetermined threshold, and said sixth means asserts said second signal if said second correlation sequence over a second period of T' samples is less than or equal to the second accumulative energy scaled by said second predetermined threshold, where T, T'∈positive integer.

3. The apparatus as recited in claim 1 wherein said first, said second correlation sequences, $\{D(n)\}$ and $\{R(n)\}$ are calculated from:

$$D(n) = \left| \sum_{k=0}^{n} r^*(k) \cdot r(k-N) \right|; r(k-N) = 0, k < N$$

and $$R(n) = \left| \sum_{k=0}^{n} r^*(k) \cdot r(k-M) \right|; r(k-M) = 0, k < M$$

where n denotes a time instant, k denotes an integer index, superscript * denotes complex conjugation, $\{r(k)\}$ denotes said sample sequence, $\{r^*(k)\}$ denotes the complex conjugate of said sample sequence, D(n) denotes a sample value of said first correlation is sequence at time instant n, and R(n) denotes a sample value of said second correlation sequence at time instant n.

4. The apparatus as recited in claim 3 wherein said third means and said fourth means obtains the first accumulative energy and the second accumulative energy, $E_D(n)$, $E_R(n)$, from time instant 2N−1 and time instant 2M−1, respectively, as follows:

$$E_D(n) = \sum_{k=0}^{n} |r(k-N)|^2, r(k-N) = 0, k < N$$

and $$E_R(n) = \sum_{k=0}^{n} |r(k-M)|^2, r(k-M) = 0, k < M.$$

5. The apparatus as recited in claim 4 wherein said fifth means asserts said first signal if the following condition can hold true for a predetermined period of T samples:

$$D(n) \geq \rho_D \cdot E_D(n)$$

where $\rho_D$ is said first predetermined threshold.

6. The apparatus as recited in claim 4 wherein said sixth means asserts said second signal if the following condition can hold true for a predetermined period of T' samples:

$$R(n) \leq \rho_R \cdot E_R(n)$$

where $\rho_R$ is said second predetermined threshold.

7. The apparatus as recited in claim 5 wherein said predetermined period of T samples begins from time instant 2N−1.

8. The apparatus as recited in claim 6 wherein said predetermined period of T' samples begins from time instant 2M−1.

9. An OFDM detection method for networking devices, comprising the steps of:
   taking a sample sequence from the beginning of a newly arrived network packet;
   calculating a first correlation sequence between the complex conjugate of said sample sequence and said sample sequence with a first lag of N samples, as well as a second correlation sequence between the complex conjugate of said sample sequence and said sample sequence with a second lag of M samples, where M, N∈positive integer and M≠N;
   normalizing said first correlation sequence to obtain a first evaluation sequence;
   normalizing said second correlation sequence to obtain a second evaluation sequence;
   determining if said newly arrived network packet is an OFDM modulated packet according to a comparison between said first evaluation sequence and a first predetermined threshold as well as another comparison between said second evaluation sequence and a second predetermined threshold.

10. The method as recited in claim 9 wherein said first evaluation sequence is obtained by normalizing said first correlation sequence with respect to accumulative energy of said sample sequence with said first lag of N samples.

11. The method as recited in claim 9 wherein said second evaluation sequence is obtained by normalizing said second correlation sequence with respect to accumulative energy of said sample sequence with said second lag of M samples.

12. The method as recited in claim 9 wherein said determining step identifies said newly arrived network packet as the OFDM modulated packet if said first evaluation sequence over a first period of T samples is greater than or equal to said first predetermined threshold and said second evaluation sequence over a second period of T' samples is less than or equal to said second predetermined threshold, where T, T'∈positive integer.

13. The method as recited in claim 9 wherein said first, and said second correlation sequences, $\{D(n)\}$ and $\{R(n)\}$, are calculated from:

$$D(n) = \left|\sum_{k=0}^{n} r^*(k) \cdot r(k-N)\right|; r(k-N) = 0, k < N$$

and $$R(n) = \left|\sum_{k=0}^{n} r^*(k) \cdot r(k-M)\right|; r(k-M) = 0, k < M$$

where
   n denotes a time instant,
   k denotes an integer index,
   superscript * denotes complex conjugation,
   $\{r(k)\}$ denotes said sample sequence,
   $\{r^*(k)\}$ denotes the complex conjugate of said sample sequence,
   D(n) denotes a sample value of said first correlation sequence at time instant n, and
   R(n) denotes a sample value of said second correlation sequence at time instant n.

14. The method as recited in claim 13 wherein said first, said second evaluation sequences, $\{D_{NL}(n)\}$, $\{R_{NL}(n)\}$, are obtained by normalizing said first and said second correlation sequences, respectively, as follows:

$$D_{NL}(n) = \frac{D(n)}{\sum_{k=0}^{n}|r(k-N)|^2}; r(k-N) = 0, k < N$$

and $$R_{NL}(n) = \frac{R(n)}{\sum_{k=0}^{n}|r(k-M)|^2}; r(k-M) = 0, k < M$$

where
   $D_{NL}(n)$ denotes a sample value of said first evaluation sequence at time instant n, and
   $R_{NL}(n)$ denotes a sample value of said second evaluation sequence at time instant n.

15. The method as recited in claim 14 wherein said determining step comprises:
   asserting a first signal if $D_{NL}(n) \geq \rho_D$ for a first predetermined period of T samples, where $\rho_D$ is said first predetermined threshold;
   asserting a second signal if $R_{NL}(n) \leq \rho_R$ for a second predetermined period of T' samples, where $\rho_R$ is said second predetermined threshold; and
   identifying said newly arrived network packet as the OFDM modulated packet if said first and said second signals are both asserted.

16. The method as recited in claim 15 wherein said first predetermined period of T samples begins from time instant 2N−1.

17. The method as recited in claim 15 wherein said second predetermined period of T' samples begins from time instant 2M−1.

18. An OFDM detection method for networking devices, comprising the steps of:
   taking a sample sequence from the beginning of a newly arrived network packet;
   forming first and second correlation sequences, $\{D(n)\}$, $\{R(n)\}$, by applying the following expressions:

$$D(n) = \left|\sum_{k=0}^{n} r^*(k) \cdot r(k-N)\right|; r(k-N) = 0, k < N$$

and $$R(n) = \left|\sum_{k=0}^{n} r^*(k) \cdot r(k-M)\right|; r(k-M) = 0, k < M$$

where
   n denotes a time instant,
   k denotes an integer index,
   superscript * denotes complex conjugation,
   $\{r(k)\}$ denotes said sample sequence,
   $\{r^*(k)\}$ denotes the complex conjugate of said sample sequence,
   D(n) denotes a sample value of said first correlation sequence at time instant n, R(n) denotes a sample value of said second correlation sequence at time instant n, M, N∈positive integer and M≠N; and determining if said newly arrived network packet is an OFDM modulated packet based on a comparison between said first correlation sequence and a first predetermined threshold over a first period of T samples from time instant 2N−1, as well as another comparison between said second correlation sequence and a second predetermined threshold over a second period of T' samples from time instant 2M−1, where T, T' ∈positive integer.

19. The method as recited in claim 18 further comprising the steps of:

evaluating first accumulative energy of said sample sequence with said first lag of N samples as follows:

$$E_D(n) = \sum_{k=0}^{n} |r(k-N)|^2$$

where $E_D(n)$ denotes the first accumulative energy at time instant n; and evaluating second accumulative energy of said sample sequence with said second lag of M samples as follows:

$$E_R(n) = \sum_{k=0}^{n} |r(k-M)|^2$$

where $E_R(n)$ denotes the second accumulative energy at time instant n.

20. The method as recited in claim 19 wherein said determining step comprises:

asserting a first signal if $D(n) \geq \rho_D \cdot E_D(n), \forall n=2N-1, 2N, \ldots, 2N+T-2$ where $\rho_D$ is said first predetermined threshold;

asserting a second signal if $R(n) \leq \rho_R \cdot E_R(n), \forall n=2M-1, 2M, \ldots, 2M+T'-2$ where $\rho_R$ is said second predetermined threshold; and identifying said newly arrived network packet as the OFDM modulated packet if said first and said second signals are both asserted.

* * * * *